(12) United States Patent
Lee et al.

(10) Patent No.: US 7,799,509 B2
(45) Date of Patent: Sep. 21, 2010

(54) PHOTOSENSITIVE RESIN COMPOSITION, METHOD OF MANUFACTURING A THIN-FILM TRANSISTOR SUBSTRATE, AND METHOD OF MANUFACTURING A COMMON ELECTRODE SUBSTRATE USING THE SAME

(75) Inventors: Hi-Kuk Lee, Yongin-si (KR); Dong-Ki Lee, Seoul (KR); Jae-Sung Kim, Yongin-si (KR); Byung-Uk Kim, Hwaseong-si (KR); Hyoc-Min Youn, Hwaseong-si (KR); Ki-Hyuk Koo, Hwaseong-si (KR); Joo-Pyo Yun, Hwaseong-si (KR); Sang-Gak Choi, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/445,846

(22) Filed: Jun. 2, 2006

(65) Prior Publication Data

US 2006/0275700 A1    Dec. 7, 2006

(30) Foreign Application Priority Data

Jun. 4, 2005    (KR) ...................... 10-2005-0048085
Apr. 24, 2006   (KR) ...................... 10-2006-0036586

(51) Int. Cl.
*G03F 7/30* (2006.01)
*G03F 7/023* (2006.01)

(52) U.S. Cl. ...................... 430/311; 430/192; 430/193; 430/270.1; 438/151

(58) Field of Classification Search .................. 430/18, 430/191, 192, 193, 326, 330, 151, 270.1, 430/905, 910, 311; 438/151
See application file for complete search history.

(56) References Cited

U.S. PATENT DOCUMENTS

| 6,399,267 | B1 * | 6/2002 | Nishimura et al. | .......... 430/192 |
| 6,515,300 | B2 * | 2/2003 | den Boer et al. | .............. 257/59 |
| 2002/0063834 | A1 | 5/2002 | Sawasaki et al. | |
| 2005/0042536 | A1 | 2/2005 | Cho et al. | |
| 2005/0264192 | A1 * | 12/2005 | Lee et al. | ...................... 313/506 |
| 2006/0166586 | A1 * | 7/2006 | Lee et al. | ....................... 445/24 |

FOREIGN PATENT DOCUMENTS

CN          1517763 A          8/2004

* cited by examiner

*Primary Examiner*—John S Chu
(74) *Attorney, Agent, or Firm*—Innovation Counsel LLP

(57) ABSTRACT

A photosensitive resin composition for an organic layer pattern includes about 100 parts by weight of an acryl-based copolymer and about 5 to about 100 parts by weight of a 1,2-quinonediazide compound. The acryl-based copolymer is prepared by copolymerizing about 5 to about 60 percent by weight of an isobonyl carboxylate-based compound based on a total weight of the acryl-based copolymer, about 10 to about 30 percent by weight of an unsaturated compound carrying an epoxy group, about 20 to about 40 percent by weight of an olefin-based unsaturated compound, and about 10 to about 40 percent by weight of one selected from unsaturated carboxylic acid, unsaturated carboxylic acid anhydride, and a mixture thereof. Methods of manufacturing a TFT substrate and a common electrode substrate using the photosensitive resin composition are also provided. Advantageously, the organic layer pattern may have a mountain structure having an improved local flatness without concave and convex structures.

3 Claims, 6 Drawing Sheets

PHOTOSENSITIVE RESIN COMPOSITION, METHOD OF MANUFACTURING A THIN-FILM TRANSISTOR SUBSTRATE, AND METHOD OF MANUFACTURING A COMMON ELECTRODE SUBSTRATE USING THE SAME

CROSS-REFERENCE TO RELATED APPLICATIONS

This application claims priority under 35 USC §119 to Korean Patent Application No. 2005-48085 filed on Jun. 4, 2005, and Korean Patent Application No. 2006-36586 filed on Apr. 24, 2006, the contents of which are herein incorporated by reference in their entireties.

BACKGROUND OF THE INVENTION

1. Field of the Invention

The present invention relates to a photosensitive resin composition, a method of manufacturing a thin-film transistor substrate, and a method of manufacturing a common electrode substrate using the photosensitive resin composition. More particularly, the present invention relates to a photosensitive resin composition for improving a local flatness of an organic layer, a method of manufacturing a thin-film transistor substrate, and a method of manufacturing a common electrode substrate using the photosensitive resin composition.

2. Description of the Related Art

In methods of forming an alignment layer for aligning a liquid crystal in a liquid crystal display device, the methods are generally classified as either a horizontal alignment method such as a Twisted Nematic (TN) mode, or an In-Plane Switching (IPS) mode, or a vertical alignment method such as a Vertical Alignment (VA) mode or a Patterned Vertical Alignment (PVA) mode, in accordance with an alignment direction of the liquid crystal when an electric field is not applied to the liquid crystal.

The VA mode may ensure a high viewing angle of a light using a Multi-Domain VA mode for aligning the liquid crystal, and a compensation film. However, a response speed of the VA mode is relatively lower than that of the IPS mode or the TN mode. Considering this problem, an organic layer having a mountain structure has been developed to improve the response speed of the VA mode when the liquid crystal is operated using a fringe field in the VA mode. For example, Korean Patent Application No. 2004-46102 discloses the organic layer having the mountain structure.

FIG. 1 is a cross-sectional view illustrating a conventional organic layer pattern having a mountain structure according to the above Korean Patent Application.

As shown in FIG. 1, although the organic layer having the mountain structure may improve a response speed of liquid crystal, the organic layer may have concave and convex structures 15 formed at protruded portions 10 thereof while forming the organic layer. When the concave and convex structures 15 are generated at the protruded portions 10 of the organic layer, the liquid crystal may not be uniformly aligned in a desired direction.

SUMMARY

The present invention provides a photosensitive resin composition for improving a local flatness of an organic layer pattern formed using the photosensitive resin composition.

The present invention also provides a method of manufacturing a thin-film transistor substrate and a common electrode substrate using the above-mentioned photosensitive resin composition.

According to one aspect of the present invention, there is provided a photosensitive resin composition including about 100 parts by weight of an acryl-based copolymer, and about 5 to about 100 parts by weight of a 1,2-quinonediazide compound. The acryl-based copolymer may be prepared by copolymerizing i) about 5 to about 60 percent by weight of an isobonyl carboxylate-based compound based on a total weight of the acryl-based copolymer, ii) about 10 to about 30 percent by weight of an unsaturated compound carrying an epoxy group based on the total weight of the acryl-based copolymer, iii) about 20 to about 40 percent by weight of an olefin-based unsaturated compound based on the total weight of the acryl-based copolymer, and iv) about 10 to about 40 percent by weight of unsaturated carboxylic acid, unsaturated carboxylic acid anhydride, or a mixture of the unsaturated carboxylic acid and unsaturated carboxylic acid anhydride.

In an example embodiment of the present invention, the isobonyl carboxylate-based compound may include a compound represented by the following chemical formula (1):

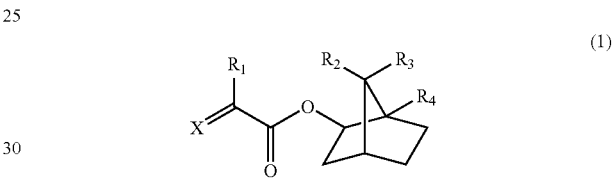

wherein X represents an alkenyl group including $C_1$-$C_{10}$, and $R_1$, $R_2$, $R_3$ and $R_4$ represent hydrogen atoms or alkyl groups including $C_1$-$C_{10}$, respectively.

In an example embodiment of the present invention, the isobonyl carboxylate-based compound may include isobonyl acrylate or isobonyl methacrylate.

In an example embodiment of the present invention, the acryl-based copolymer may have a weight average molecular weight of about 5,000 to about 30,000 based on polystyrene standards.

In an example embodiment of the present invention, the unsaturated carboxylic acid may include acrylic acid, methacrylic acid, maleic acid, fumaric acid, citraconic acid, mesaconic acid, itaconic acid, etc.

In an example embodiment of the present invention, the unsaturated compound carrying an epoxy group may include glycidyl acrylate, glycidyl methacrylate, glycidyl alpha-ethylacrylate, glycidyl alpha-N-propylacrylate, glycidyl alpha-N-butylacrylate, glycidyl beta-methyl acrylate, glycidyl beta-methyl methacrylate, glycidyl beta-ethylacrylate, glycidyl beta-ethyl methacrylate, 3,4-epoxybutyl acrylate, 3,4-epoxybutyl methacrylate, 6,7-epoxyheptyl acrylate, 6,7-epoxyheptyl methacrylate, 6,7-epoxyheptyl alpha-ethylacrylate, o-vinylbenzyl glycidyl ether, m-vinylbenzyl glycidyl ether, p-vinylbenzyl glycidyl ether, etc.

In an example embodiment of the present invention, the olefin-based unsaturated compound may include methylmethacrylate, ethyl methacrylate, N-butyl methacrylate, sec-butyl methacrylate, tert-butyl methacrylate, methyl acrylate, isopropyl acrylate, cyclohexyl methacrylate, 2-methyl cyclohexyl methacrylate, dicyclopentenyl acrylate, dicyclopentanyl acrylate, dicyclopentenyl methacrylate, dicyclopentanyl methacrylate, dicyclopentanyloxyethyl methacrylate, isobonyl methacrylate, cyclohexyl acrylate, 2-methylcyclohexyl acrylate, dicyclopentanyloxyethyl acrylate, isobonyl acrylate, phenyl methacrylate, phenyl acrylate, benzyl acrylate, 2-hydroxyethyl methacrylate, styrene, alpha-methylstyrene, m-methylstyrene, p-methoxystyrene, vinyl toluene, p-methylstyrene, 1,3-butadiene, isoprene, 2,3-dimethyl-1,3-butadiene, etc.

In an example embodiment of the present invention, the 1,2-quinonediazide compound may include 1,2-quinonediazide-4-sulfonate ester, 1,2-quinonediazide-5-sulfonate ester, 1,2-quinonediazide-6-sulfonate ester, etc.

In an example embodiment of the present invention, the photosensitive resin composition may further include an additive. The additive may include an epoxy resin, an adhesive, an acryl compound and/or a surfactant.

According to another aspect of the present invention, there is provided a method of manufacturing a thin-film transistor substrate. In the method, a gate metal pattern including a gate electrode is formed on a base substrate. A gate-insulating layer is formed on the gate metal pattern. A channel layer corresponding to the gate electrode is formed on the gate-insulating layer. A source metal pattern including a source electrode and a drain electrode is formed on the gate-insulating layer having the channel layer. An overcoating layer is formed on the gate-insulating layer, the channel layer and the source metal pattern. The overcoating layer has a contact hole through which the drain electrode is exposed. A pixel electrode layer is formed on the overcoating layer. The pixel electrode layer is electrically connected to the drain electrode via the contact hole and has a boundary portion. A photosensitive resin composition, an example of which is described above, is coated on the pixel electrode layer. The photosensitive resin composition is exposed to a light. The photosensitive resin composition exposed to the light is developed to form a tilted layer having a tapered structure.

According to still another aspect of the present invention, there is provided a method of manufacturing a common electrode substrate. In the method, a light-blocking layer is formed on a base substrate. A color filter layer covering a portion of the light-blocking layer is formed on the substrate. An insulating layer is formed on the light-blocking layer and the color filter layer. A common electrode layer having a boundary portion is formed on the insulating layer. A photosensitive resin composition, an example of which is described above, is coated on the common electrode layer. The photosensitive resin composition is exposed to a light. The photosensitive resin composition exposed to the light is developed to form a tilted layer having a tapered structure.

According to the present invention, an organic layer pattern formed using a photosensitive resin composition may have a mountain structure having an improved local flatness to thereby ensure more rapid response speed on a liquid crystal formed on the organic layer pattern.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

The above and other features and advantages of the present invention will become more apparent by describing in detail example embodiments thereof with reference to the accompanying drawings, in which.

Figure 1:
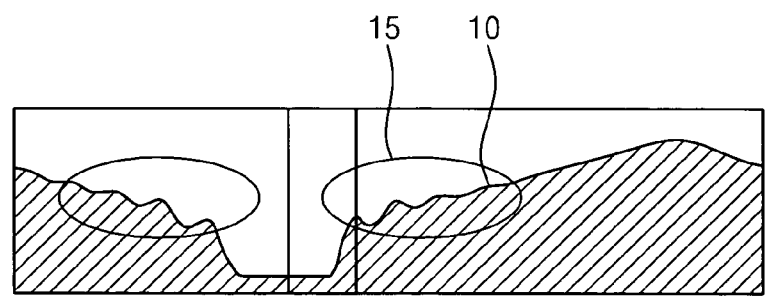
FIG. 1 is a cross-sectional view illustrating a conventional organic layer pattern having a mountain structure.

Embodiments of the present invention and their advantages are best understood by referring to the detailed description that follows. It should be appreciated that like reference numerals are used to identify like elements illustrated in one or more of the figures. It should also be appreciated that the figures may not be necessarily drawn to scale.

DETAILED DESCRIPTION

The present invention is described more fully hereinafter with reference to the accompanying drawings, in which example embodiments of the present invention are shown. The present invention may, however, be embodied in many different forms and should not be construed as limited to the example embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element (s) or feature (s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Method of Forming an Organic Layer Pattern

After a substrate is cleaned for forming an organic layer pattern thereon, a photosensitive resin composition is coated on the substrate. The substrate may include a lower structure that has a conductive pattern, a contact region, a pad, a contact, an insulation layer pattern, a wiring, a transistor, etc. The photosensitive resin composition may be formed on the substrate by a spin coating process, a slit coating process or a combination process of spin coating and slit coating. The photosensitive resin composition may include an acryl-based copolymer and a 1,2-quinonediazide compound. The acryl-based copolymer may be prepared by copolymerizing an isobonyl carboxylate-based compound, an unsaturated compound carrying an epoxy group, an olefin-based unsaturated compound, and one of unsaturated carboxylic acid, unsaturated carboxylic acid anhydride and a mixture of the unsaturated carboxylic acid and unsaturated carboxylic acid anhydride.

The coated photosensitive resin composition is exposed to a light, and then the exposed photosensitive resin composition is developed to thereby form an organic layer pattern on the substrate. That is, an exposure process and a developing process are performed on the organic layer to thereby form the organic layer pattern. The organic layer pattern is hardened through a hardening process such as a baking process. Thus, a mountain-structured organic layer pattern having an improved local flatness is formed on the substrate.

Hereinafter, ingredients of the photosensitive resin composition of the present invention will be described in detail.

Acryl-Based Copolymer

An acryl-based copolymer in the photosensitive resin composition of the present invention may effectively prevent generation of defects, such as scum, on the organic layer pattern in the developing process.

In some embodiments of the present invention, the acryl-based copolymer may be prepared by polymerizing a first monomer, a second monomer, a third monomer and a fourth monomer with a solvent and an initiator. The first monomer may include an isobonyl carboxylate-based compound. The second monomer may include unsaturated carboxylic acid, unsaturated carboxylic acid anhydride or a mixture thereof. The third monomer may include an unsaturated compound carrying an epoxy group, and the fourth monomer may include an olefin-based unsaturated compound.

When a content of the first monomer in the acryl-based copolymer, such as an isobonyl carboxylate-based compound, is below about 5 percent by weight based on a total weight of the acryl-based copolymer, heat resistance of the organic layer pattern may deteriorate. When the content of the first monomer is above about 60 percent by weight based on the total weight of the acryl-based copolymer, a solubility of the acryl-based copolymer relative to an alkali aqueous solution may be reduced. Therefore, the content of the first monomer in the acryl-based copolymer is advantageously in a range of about 5 to about 60 percent by weight based on a total weight of the acryl-based copolymer. For example, the content of the isobonyl carboxylate-based compound in the acryl-based copolymer may be about 10 to about 40 percent by weight.

The isobonyl carboxylate-based compound may include a compound represented by the following chemical formula (1):

$$\underset{X}{\overset{R_1}{\diagup}}\hspace{-0.3em}=\hspace{-0.3em}\underset{O}{\overset{}{\diagdown}}\hspace{-0.3em}C\hspace{-0.3em}-\hspace{-0.3em}O\hspace{-0.3em}-\hspace{-0.3em}\underset{R_4}{\overset{R_2\,R_3}{\diagup}} \quad (1)$$

wherein X indicates an alkenyl group including $C_1$-$C_{10}$, and $R_1$, $R_2$, $R_3$ and $R_4$ represent hydrogen atoms or alkyl groups of $C_1$-$C_{10}$, respectively. The compound can be used alone or in a mixture thereof.

In some embodiments of the present invention, the isobonyl carboxylate-based compound may include isobonyl acrylate or isobonyl methacrylate.

When a content of the second monomer such as the unsaturated carboxylic acid, the unsaturated carboxylic acid anhydride or the mixture thereof in the acryl-based copolymer is below about 10 percent by weight based on the total weight of the acryl-based copolymer, the solubility of the acryl-based copolymer relative to the alkali aqueous solution may decrease. When the content of the second monomer in the acryl-based copolymer is above about 40 percent by weight, the solubility of the acryl-based copolymer relative to the alkali aqueous solution may excessively increase. Therefore, the content of the second monomer in the acryl-based copolymer is advantageously in a range of about 10 to about 40 percent by weight based on the total weight of the acryl-based copolymer. For example, the acryl-based copolymer may include about 10 to about 30 percent by weight of the second monomer such as the unsaturated carboxylic acid, the unsaturated carboxylic acid anhydride or the mixture thereof.

Examples of the unsaturated carboxylic acid may include unsaturated monocarboxylic acid such as acrylic acid or methacrylic acid, and unsaturated dicarboxylic acid such as maleic acid, fumaric acid, citraconic acid, mesaconic acid or itaconic acid. These can be used alone or in a mixture thereof. In some embodiments of the present invention, acrylic acid, methacrylic acid or maleic anhydride may be employed as the unsaturated carboxylic acid because of their excellent copolymerization reactivity and good solubility relative to the alkali aqueous solution.

When a content of the third monomer such as the unsaturated compound carrying an epoxy group in the acryl-based copolymer is below about 10 percent by weight based on the total weight of the acryl-based copolymer, the heat resistance of the organic layer pattern may be reduced. When the content of the third monomer in the acryl-based copolymer is above about 70 percent by weight, stability of the photosensitive resin composition relative to time may deteriorate. Therefore, the content of the third monomer is advantageously in a range of about 10 to about 30 percent by weight based on the total weight of the acryl-based copolymer. For example, the content of the unsaturated compound carrying an epoxy group in the acryl-based copolymer may be about 15 to about 25 percent by weight.

Examples of the unsaturated compound carrying an epoxy group may include glycidyl acrylate, glycidyl methacrylate, glycidyl alpha-ethylacrylate, glycidyl alpha-N-propylacrylate, glycidyl alpha-N-butylacrylate, glycidyl beta-methyl acrylate, glycidyl beta-methyl methacrylate, glycidyl beta-ethylacrylate, glycidyl beta-ethyl methacrylate, 3,4-epoxybutyl acrylate, 3,4-epoxybutyl methacrylate, 6,7-epoxyheptyl acrylate, 6,7-epoxyheptyl methacrylate, 6,7-epoxyheptyl alpha-ethylacrylate, o-vinylbenzyl glycidyl ether, m-vinylbenzyl glycidyl ether, p-vinylbenzyl glycidyl ether, etc. These compounds can be used alone or in combination as mixtures thereof. In some embodiments of the present invention, glycidyl methacrylate, glycidyl beta-methyl methacrylate, 6,7-epoxyheptyl methacrylate, o-vinylbenzyl glycidyl ether, m-vinylbenzyl glycidyl ether or p-vinylbenzyl glycidyl ether may be advantageously used as the unsaturated compound carrying an epoxy group because of their high copolymerization reactivity and high heat resistance of the organic layer pattern.

When a content of the fourth monomer such as the olefin-based unsaturated compound in the acryl-based copolymer is below about 20 percent by weight based on the total weight of the acryl-based copolymer, the stability of the photosensitive resin composition relative to time may decrease. When the content of the fourth monomer in the acryl-based copolymer is above about 40 percent by weight, the acryl-based copolymer may be hindered from dissolving in the alkali aqueous solution. Therefore, the content of the fourth monomer such as the olefin-based unsaturated compound in the acryl-based copolymer is advantageously in a range of about 20 to about 40 percent. For example, a content of the olefin-based unsaturated compound in the acryl-based copolymer may be about 25 to about 35 percent by weight based on the total weight of the acryl-based copolymer.

Examples of the olefin-based unsaturated compound may include methyl methacrylate, ethyl methacrylate, N-butyl methacrylate, sec-butyl methacrylate, tert-butyl methacrylate, methyl acrylate, isopropyl acrylate, cyclohexyl methacrylate, 2-methyl cyclohexyl methacrylate, dicyclopentenylacrylate, dicyclopentanylacrylate, dicyclopentenyl methacrylate, dicyclopentanyl methacrylate, dicyclopentanyloxyethyl methacrylate, isobonyl methacrylate, cyclohexyl acrylate, 2-methylcyclohexyl acrylate, dicyclopentanyloxyethyl acrylate, isobonyl acrylate, phenyl methacrylate, phenyl acrylate, benzyl acrylate, 2-hydroxyethyl methacrylate, styrene, alpha-methylstyrene, m-methylstyrene, p-methoxystyrene, vinyl toluene, p-methylstyrene, 1,3-butadiene, isoprene, 2,3-dimethyl-1,3-butadiene, etc. These compounds can be used alone or in combination as mixtures thereof. In some embodiments of the present invention, styrene, dicyclopentanyl methacrylate or p-methoxystyrene may be advantageously used as the olefin-based unsaturated compound because of their excellent copolymerization reactivity and the high solubility relative to the alkali aqueous solution.

Examples of the solvent for polymerizing of the acryl-based copolymer may include methanol, tetrahydrofuran, ethylene glycol monomethyl ether, methyl cellosolve acetate, ethyl cellosolve acetate, diethylene glycol monomethyl ether, diethylene glycol monoethyl ether, ethylene glycol dimethyl ether, ethylene glycol diethyl ether, ethylene glycol methylethyl ether, propylene glycol monoethyl ether, propylene glycol propylether, propylene glycol butyl ether, propylene glycol methylethyl acetate, propylene glycol ethyl ether acetate, propylene glycol propylether acetate, propylene glycol butyl ether acetate, propylene glycol methylethyl propionate, propylene glycol ethyl ether propionate, propylene glycol propylether propionate, propylene glycol butyl ether propionate, toluene, xylene, methyl ethyl ketone, cyclohexanone, 4-hydroxy-4-methyl-2-pentanone, methyl acetate, ethyl acetate, propyl acetate, butyl acetate, ethyl 2-hydroxy propionate, methyl 2-hydroxy-2-methyl propionate, ethyl 2-hydroxy-2-methyl propionate, methyl hydroxylacetate, ethyl hydroxylacetate, butyl hydroxylacetate, methyl lactate, ethyl lactate, propyl lactate, butyl lactate, methyl 3-hydroxypropionate, ethyl 3-hydroxypropionate, propyl 3-hydroxypropionate, butyl 3-hydroxypropionate, methyl 2-hydroxy-3-methylbutyrate, methyl methoxyacetate, ethyl methoxyacetate, propyl methoxyacetate, butyl methoxyacetate, methyl ethoxyacetate, ethyl ethoxyacetate, propyl ethoxyacetate, butyl ethoxyacetate, methyl propoxyacetate, ethyl propoxyacetate, propyl propoxyacetate, butyl propoxyacetate, methyl butoxyacetate, ethyl butoxyacetate, propyl butoxyacetate, butyl butoxyacetate, methyl 2-methoxypropionate, ethyl 2-methoxypropionate, propyl 2-methoxypropionate, butyl 2-methoxypropionate, methyl 2-ethoxypropionate, ethyl 2-ethoxypropionate, propyl 2-ethoxypropionate, butyl 2-ethoxypropionate, methyl 2-butoxypropionate, ethyl 2-butoxypropionate, propyl 2-butoxypropionate, butyl 2-butoxypropionate, methyl 3-methoxypropionate, ethyl 3-methoxypropionate, propyl 3-methoxypropionate, butyl 3-methoxypropionate, methyl 3-ethoxypropionate, ethyl 3-ethoxypropionate, propyl 3-ethoxypropionate, butyl 3-ethoxypropionate, methyl 3-propoxypropionate, ethyl 3-propoxypropionate, propyl 3-propoxypropionate, butyl 3-propoxypropionate, methyl 3-butoxypropionate, ethyl 3-butoxypropionate, propyl 3-butoxypropionate, butyl 3-butoxypropionate, etc. These solvents can be used alone or in combination as mixtures thereof.

The initiator for polymerizing the acryl-based copolymer may include a radical initiator. Examples of the radical initiator may include 2,2'-azobisisobutylnitrile, 2,2'-azobis(2,4-dimethylvaleronitrile), 2,2'-azobis(4-methoxy-2,4-dimethylvaleronitrile), 1,1'-azobis(cyclohexane-1-carbonitrile), dimethyl 2,2'-azobisisobutylate, etc.

In some embodiments of the present invention, the acryl-based copolymer may have a weight average molecular weight (Mw) of about 5,000 to about 30,000 based on polystyrene standards. For example, the acryl-based copolymer may have a weight average molecular weight of about 5,000 to about 20,000 based on polystyrene standards. When the weight average molecular weight of the acryl-based copolymer is below about 5,000, developing characteristics of the organic layer may be deteriorated or a remaining thickness of the organic layer may be reduced. Additionally, a profile of the organic layer pattern may be deteriorated or the heat resistance of the organic layer pattern may be lowered. When the weight average molecular weight of the acryl-based copolymer is above about 30,000, a photosensitivity of the composition may be decreased or the profile of the organic layer pattern may be lowered.

1,2-quinonediazide Compound

The photosensitive resin composition of the present invention may include a 1,2-quinonediazide compound as a photosensitive compound.

Examples of the 1,2-quinonediazide compound may include 1,2-quinonediazide-4-sulfonate ester, 1,2-quinonediazide-5-sulfonate ester, 1,2-quinonediazide-6-sulfonate ester, etc.

The 1,2-quinonediazide compound may be obtained by synthesizing a naphthoquinone diazide sulfonate halogen compound and a phenol compound under a weak base condition in one example.

Examples of the phenol compound may include 2,3,4-trihydroxybenzophenone, 2,4,6-trihydroxybenzophenone, 2,2'-tetrahydroxybenzophenone, 4,4'-tetrahydroxybenzophenone, 2,3,4,3'-tetrahydroxybenzophenone, 2,3,4,4'-tetrahydroxybenzophenone, 2,3,4,2'-tetrahydroxy-4'-methylbenzophenone, 2,3,4,4'-tetrahydroxy-3'-methoxybenzophenone, 2,3,4,2'-pentahydroxybenzophenone, 2,3,4,6'-pentahydroxybenzophenone, 2,4,6,3'-hexahydroxybenzophenone, 2,4,6,4'-hexahydroxybenzophenone, 2,4,6,5'-hexahydroxybenzophenone, 3,4,5,3'-hexahydroxybenzophenone, 3,4,5,4'-hexahydroxybenzophenone, 3,4,5,5'-hexahydroxybenzophenone, bis(2,4-dihydroxyphenyl)methane, bis(p-hydroxyphenyl)methane, tri(p-hydroxyphenyl)methane, 1,1,1-tri(p-hydroxyphenyl)ethane, bis(2,3,4-trihydroxyphenyl)methane, 2,2-bis(2,3,4-trihydroxyphenyl)propane, 1,1,3-tri(2,5-dimethyl-4-hydroxyphenyl)-3-phenylpropane, 4,4'-[1-[4-[1-[4-hydroxyphenyl]-1-methylethyl]phenyl]ethylidene]bisphenol, bis(2,5-dimethyl-4-hydroxyphenyl)-2-hydroxyphenylmethane, etc. These compounds can be used alone or in combination as mixtures thereof.

In the synthesis of the 1,2-quinonediazide compound, the ester degree of the 1,2-quinonediazide compound may be in a range of about 50 to about 85 percent. When the ester degree of the 1,2-quinonediazide compound is below about 50 percent, the remaining thickness of the organic compound may be decreased. When the ester degree of the 1,2-quinonediazide compound is above about 85 percent, the stability of the photosensitive resin composition relative to time may be deteriorated.

When a content of the 1,2-quinonediazide compound is below about 5 parts by weight in the photosensitive resin composition with respect to about 100 parts by weight of the acryl-based copolymer, a solubility difference between an exposed portion and an unexposed portion of the organic layer may be reduced so that the organic layer pattern having the mountain structure may not be formed on the substrate. When the content of the 1,2-quinonediazide compound is above about 100 parts by weight relative to about 100 parts by weight of the acryl-based copolymer, much unreacted 1,2-quinonediazide compound may remain in the photosensitive resin composition when a light is irradiated on the photosensitive resin composition for a relatively short time. Hence, the organic layer may not be properly developed because the solubility of the photosensitive resin composition relative to the alkali aqueous solution may be excessively lowered. Therefore, the content of the 1,2-quinonediazide compound in the photosensitive resin composition may be in a range of about 5 to about 100 parts by weight with respect to about 100 parts by weight of the acryl-based copolymer. For example, the photosensitive resin composition may include about 10 to about 50 parts by weight of the 1,2-quinonediazide compound relative to about 100 parts by weight of the acryl-based copolymer.

In some embodiments of the present invention, the photosensitive resin composition may further include an additive such as an epoxy resin, an adhesive, an acryl-based compound and/or a surfactant.

The epoxy resin may improve the heat resistance and the light sensitivity of the organic pattern formed using the photosensitive resin composition. Examples of the epoxy resin may include a bisphenol A epoxy resin, a phenol novolak epoxy resin, a cresol novolak epoxy resin, a cycloaliphatic epoxy resin, a glycidyl ester epoxy resin, a glycidyl amine epoxy resin, a heterocyclic epoxy resin, a resin synthesized by glycidyl methacrylate different from that in the acryl-based copolymer, etc. In some embodiments of the present invention, the bisphenol A epoxy resin, the cresol novolak epoxy resin or the glycidyl ester epoxy resin may be advantageously employed in the photosensitive resin composition as the epoxy resin. A content of the epoxy resin in the photosensitive resin composition may be in a range of about 0.1 to about 30 parts by weight relative to about 100 parts by weight of an alkali soluble resin contained in the photosensitive resin composition. When the content of the epoxy resin in the photosensitive resin compound is above about 30 parts by weight with respect to about 100 parts by weight of the alkali soluble resin, a compatibility of the epoxy resin relative to the alkali soluble resin may be lowered so that the photosensitive resin compound may not be properly coated on the substrate.

The adhesive in the photosensitive resin compound may improve adhesion strength between the substrate and the photosensitive resin compound. A content of the adhesive in the photosensitive resin compound may be in a range of about 0.1 to about 20 parts by weight based on about 100 parts by weight of the acryl-based copolymer. In some embodiments of the present invention, the adhesive may include mercaptopropyl trimethoxysilane containing a substitution group such as a carboxyl group, a methacryl group, an isocyanate group, an epoxy group, etc. Examples of the adhesive may include gamma-methacryloxypropyltrimethoxysilane, vinyltriacetoxy silane, vinyltrimethoxy silane, gamma-isocyanate propyltriethoxy silane, gamma-glycycloxypropyltrimethoxysilane, beta-3,4-epoxycyclohexylethyltrimethoxysilane, etc. These adhesives can be used alone or in combination as mixtures thereof.

The acryl-based compound in the photosensitive resin compound may enhance the light permeability, the heat resistance and the light sensitivity of the organic layer pattern formed using the photosensitive resin composition. A content of the acryl-based compound in the photosensitive resin composition may be about 0.1 to about 30 parts by weight based on about 100 parts by weight of the acryl-based copolymer.

For example, the content of the acryl-based compound in the photosensitive resin composition may be in a range of about 0.1 to about 15 parts by weight.

The surfactant may improve the coating and the developing characteristics of the photosensitive resin composition. Examples of the surfactant may include polyoxyethylene octylphenyl ether, polyoxyethylene nonylphenyl ether, F171 (trade name; manufactured by Dainippon Ink and Chemicals, Inc. in Japan), F172 (trade name; manufactured by Dainippon Ink and Chemicals, Inc. in Japan), F173 (trade name; manufactured by Dainippon Ink and Chemicals, Inc. in Japan), FC430 (trade name; manufactured by Sumitomo 3M, Ltd. in Japan), FC431 (trade name; manufactured by Sumitomo 3M, Ltd. in Japan), KP341 (trade name, manufactured by Shin-Etsu Chemical Co., Ltd. in Japan), etc. A content of the surfactant in the photosensitive resin composition may be in a range of about 0.0001 to about 2 parts by weight with respect to about 100 parts by weight of a solid ingredient contained in the photosensitive resin composition.

In some embodiments of the present invention, a photosensitive resin composition solution may include a solvent, the photosensitive resin composition that contains the acryl-based copolymer, the 1,2-quinonediazide compound and the additive.

A content of a solid ingredient in the photosensitive resin composition solution may be in a range of about 15 to about 50 percent by weight based on a total weight of the coating solution. The solid ingredient in the coating solution may be filtered using a pore filter that has a pore size of about 0.1 to about 0.2 µm in one example.

Examples of the solvent for preparing the photosensitive resin composition solution may include an alcohol such as methanol and/or ethanol; an ether such as tetrahydrofuran; a glycol ether such as ethylene glycol monomethyl ether and/or ethylene glycol monoethyl ether; an ethylene glycol alkyl ether acetate such as methyl cellosolve acetate and/or ethyl cellosolve acetate; a diethylene glycol such as diethylene glycol monomethyl ether, diethylene glycol monoethyl ether, diethylene glycol dimethyl ether, or combinations thereof; a propylene glycol monoalkyl ether such as propylene glycol methyl ether, propylene glycol ethyl ether, propylene glycol propyl ether, propylene glycol butyl ether, or combinations thereof; a propylene glycol alkyl ether acetate such as propylene glycol methylether acetate, propylene glycol ethyl ether acetate, propylene glycol propylether acetate, propylene glycol butyl ether acetate, or combinations thereof; a propylene glycol alkyl ether propionate such as propylene glycol methylether propionate, propylene glycol ethyl ether propionate, propylene glycol propylether propionate, propylene glycol butyl ether propionate, or combinations thereof; an aromatic hydrocarbon such as toluene and/or xylene; a ketone such as methylethyl ketone, cyclohexanone, 4-hydroxy-4-methyl-2-pentanone, or combinations thereof; an ester such as methyl acetate, ethyl acetate, propyl acetate, butyl acetate, ethyl 2-hydroxy propionate, methyl 2-hydroxy-2-methyl propionate, ethyl 2-hydroxy-2-methyl propionate, methyl hydroxylacetate, ethyl hydroxylacetate, butyl hydroxylacetate, methyl lactate, ethyl lactate, propyl lactate, butyl lactate, methyl 3-hydroxypropionate, ethyl 3-hydroxypropionate, propyl 3-hydroxypropionate, butyl 3-hydroxypropionate, methyl 2-hydroxy-3-methylbutyrate, methyl methoxyacetate, ethyl methoxyacetate, propyl methoxyacetate, butyl methoxyacetate, methyl ethoxyacetate, ethyl ethoxyacetate, propyl ethoxyacetate, butyl ethoxyacetate, methyl propoxyacetate, ethyl propoxyacetate, propyl propoxyacetate, butyl propoxyacetate, methyl butoxyacetate, ethyl butoxyacetate, propyl butoxyacetate, butyl butoxyacetate, methyl 2-methoxypropionate, ethyl 2-methoxypropionate, propyl 2-methoxypropionate, butyl 2-methoxypropionate, methyl 2-ethoxypropionate, ethyl 2-ethoxypropionate, propyl 2-ethoxypropionate, butyl 2-ethoxypropionate, methyl 2-butoxypropionate, ethyl 2-butoxypropionate, propyl 2-butoxypropionate, butyl 2-butoxypropionate, methyl 3-methoxypropionate, ethyl 3-methoxypropionate, propyl 3-methoxypropionate, butyl 3-methoxypropionate, methyl 3-ethoxypropionate, ethyl 3-ethoxypropionate, propyl 3-ethoxypropionate, butyl 3-ethoxypropionate, methyl 3-propoxypropionate, ethyl 3-propoxypropionate, propyl 3-propoxypropionate, butyl 3-propoxypropionate, methyl 3-butoxypropionate, ethyl 3-butoxypropionate, propyl 3-butoxypropionate, butyl 3-butoxypropionate, etc. In some embodiments of the present invention, glycolether, ethylene glycol alkyl ether acetate or diethylene glycol may be advantageously used for the coating solution as the solvent because of their excellent solubility, good reactivity relative to ingredients in the photosensitive resin composition, and coating characteristics of the coating solution.

In some embodiments of the present invention, the coating solution including the photosensitive resin composition may be formed on the substrate by a spray process, a roll coating process or a spin coating process, and then the organic layer may be formed on the substrate by removing the solvent from the coating solution through a pre-baking process. The pre-baking process may be executed at a temperature of about 70 to about 110° C. for about 1 to about 15 minutes. After the organic layer is exposed to a visible ray, an ultraviolet ray, an extreme ultraviolet ray, an electron beam, or an X-ray, the organic layer pattern may be formed on the substrate by developing the organic layer using a developing solution.

The developing solution may include an alkali aqueous solution. Examples of the developing solution may include an inorganic alkali such as sodium hydroxide, potassium hydroxide or sodium carbonate; a primary amine such as ethylamine; a secondary amine such as diethyl amine or n-propyl amine; a tertiary amine such as trimethyl amine, methyldiethyl amine, dimethylethyl amine or triethyl amine; an alcohol amine such as dimethylethanol amine, methyldiethanol amine or triethanol amine; an aqueous solution of a quaternary ammonium salt such as tetramethylammonium hydroxide or tetraethylammonium hydroxide, etc. The developing solution may include about 0.1 to about 10 percent by weight of an alkali compound based on a total weight of the developing solution. Additionally, the developing solution may include a surfactant and an aqueous organic solvent such as methanol or ethanol.

In some embodiments of the present invention, the organic layer pattern may be formed on the substrate by cleaning the developed organic layer using deionized water for about 30 to about 90 seconds and by irradiating the ultraviolet ray onto the organic layer. When the substrate having the organic layer thereon is thermally treated using a heating apparatus such as an oven at a temperature of about 150 to about 250° C. for about 20 to about 90 minutes, the organic layer pattern is completed on the substrate. For example, the organic layer pattern is formed by a thermal treatment process performed at a temperature of about 220° C. for about 30 to about 60 minutes.

Method of Manufacturing a Thin-Film Transistor Substrate

FIGS. 2A to 2G are cross-sectional views illustrating a method of manufacturing a thin-film transistor substrate according to an embodiment of the present invention.

Figure 2A:
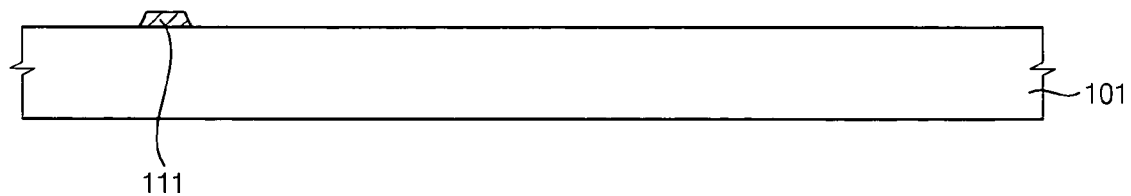
FIGS. 2A to 2G are cross-sectional views illustrating a method of manufacturing a thin-film transistor substrate according to an embodiment of the present invention.

Referring to FIG. 2A, a metal layer (not shown) is formed on a base substrate 101. Thereafter, the metal layer is etched by performing a photolithography process to form a gate metal pattern including a gate line (not shown), a gate electrode 111 and a storage common line (not shown).

Examples of the metal layer may include chrome, aluminum, tantalum, molybdenum, titanium, tungsten, copper, silver, or an alloy thereof, and be deposited through a sputtering process. The metal layer may include at least two layers of which physical properties are different from each other.

Figure 2B:
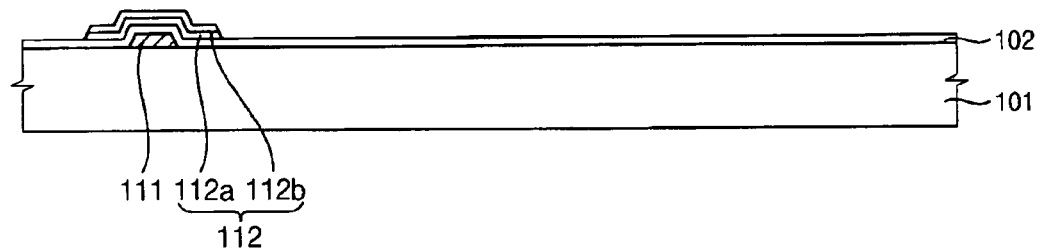

Referring to FIG. 2B, a gate-insulating layer 102 including a silicon nitride layer SiNx, an amorphous silicon layer 112a and an in-situ doped n+ amorphous silicon layer 112b are formed in turn on the base substrate 101 having the gate metal pattern. Thereafter, the amorphous silicon layer 112a and the in-situ doped n+ amorphous silicon layer 112b are etched by using a photolithography process to form a channel layer 112 corresponding to the gate electrode 111.

Figure 2C:
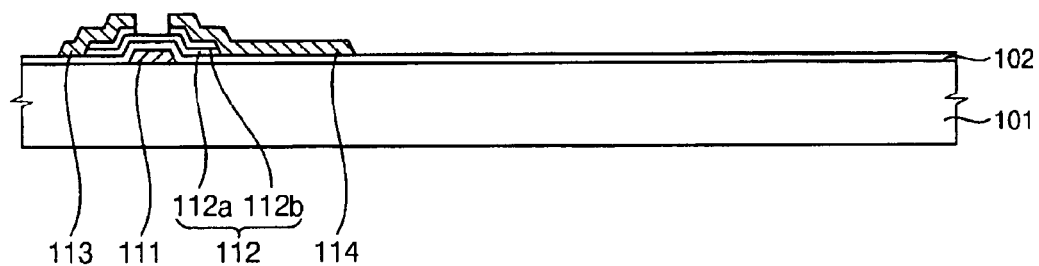

Referring to FIG. 2C, a metal layer (not shown) is formed on the gate-insulating layer 102 having the channel layer 112. Examples of the metal layer may include chrome, aluminum, tantalum, molybdenum, titanium, tungsten, copper, silver, or an alloy thereof, and be deposited through a sputtering process. The metal layer may include at least two layers of which physical properties are different from each other.

A source metal pattern including a source electrode 113, a drain electrode 114 and a source line (not shown) is formed by etching the metal layer. The source electrode 113 is spaced apart from the drain electrode 114 by a predetermined distance.

The amorphous silicon layer 112a is exposed by etching the n+ amorphous silicon layer 112b between the source electrode 113 and the drain electrode 114.

Figure 2D:
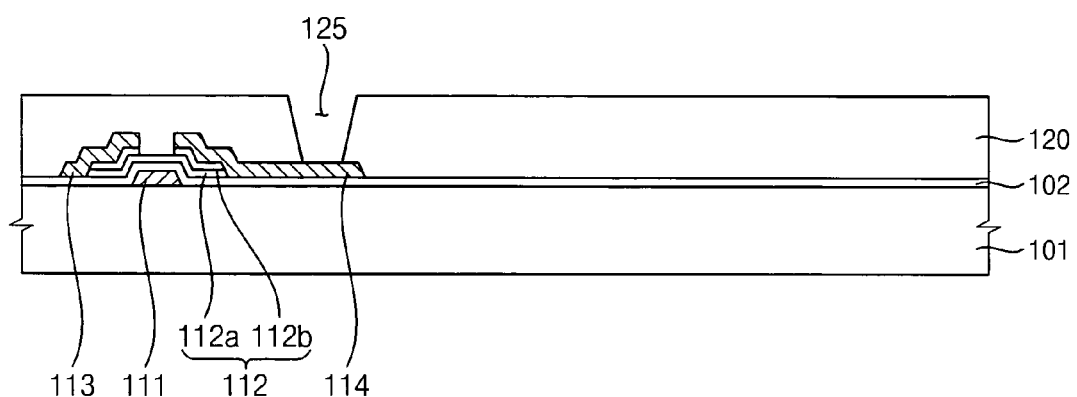

Referring to FIG. 2D, a photoresist layer is formed on the source metal pattern and the gate-insulating layer 102. The photoresist layer is exposed to a light and is developed to form an overcoating layer 120 including a contact hole 125. A portion of the drain electrode 114 is exposed through the contact hole 125.

Figure 2E:
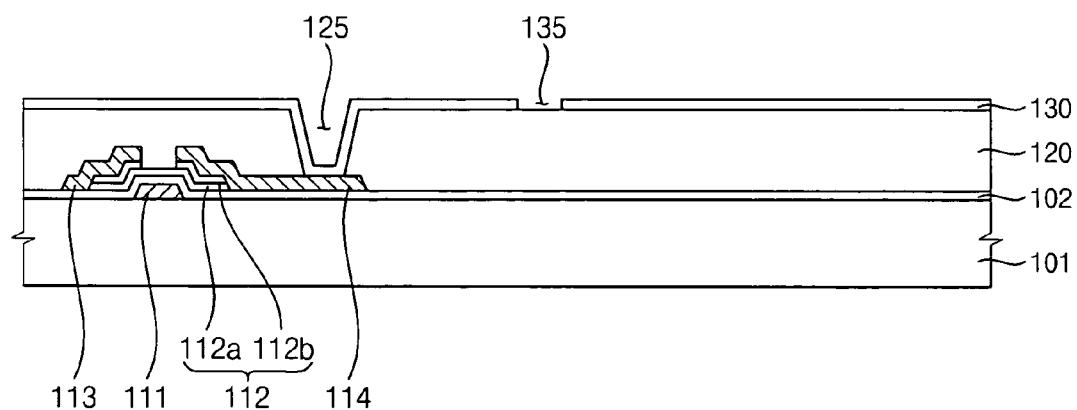

Referring to FIG. 2E, a transparent conducting layer (not shown) is formed on the overcoating layer 120. Examples of the transparent conducting layer may include indium tin oxide (ITO), indium zinc oxide (IZO), etc. The transparent conducting layer is etched through a photolithography process to form a pixel electrode layer 130. The pixel electrode layer 130 is electrically connected to the drain electrode 114 via the contact hole 125 and includes a boundary portion 135 to divide the pixel electrode layer 130 into a plurality of domains. The boundary portion 135 may be a cutout portion.

Figure 2F:
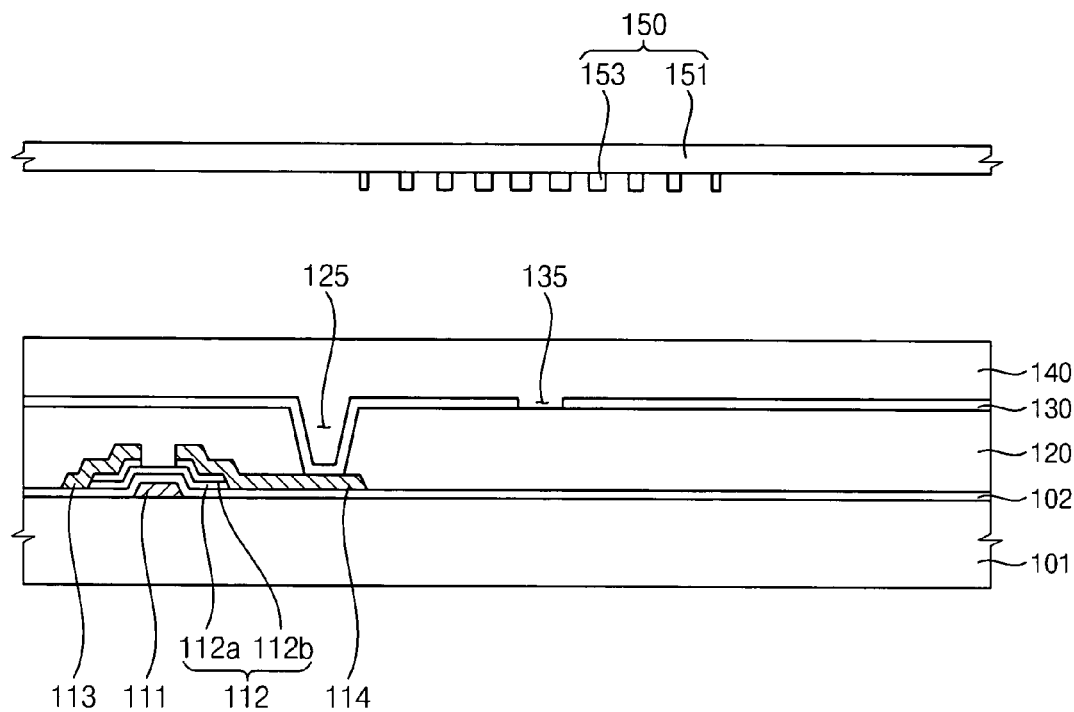

Referring to FIG. 2F, a photosensitive resin composition is coated on the pixel electrode layer 130 to form an organic layer 140. The photosensitive resin composition includes the above-mentioned photosensitive resin composition according to an embodiment of the present invention. In detail, examples of the photosensitive resin composition may include about 100 parts by weight of an acryl-based copolymer, and about 5 to about 100 parts by weight of a 1,2-quinonediazide compound. The acryl-based copolymer may be prepared by copolymerizing i) about 5 to about 60 percent by weight of an isobonyl carboxylate-based compound based on a total weight of the acryl-based copolymer, ii) about 10 to about 30 percent by weight of an unsaturated compound carrying an epoxy group based on the total weight of the acryl-based copolymer, iii) about 20 to about 40 percent by weight of an olefin-based unsaturated compound based on the total weight of the acryl-based copolymer, and iv) about 10 to about 40 percent by weight of unsaturated carboxylic acid, unsaturated carboxylic acid anhydride, or a mixture of the unsaturated carboxylic acid and unsaturated carboxylic acid anhydride.

The organic layer 140 is exposed to a light through a mask 150. The mask 150 includes a transparent substrate 151 and a plurality of light-blocking patterns 153. The light-blocking patterns 153 are spaced apart from each other by predetermined distances. A gap between the light-blocking patterns 153 corresponds to a slit. An amount of exposing light is varied according to a distance between the light-blocking patterns 153. In detail, the amount of exposing light increases as the distance increases between the light-blocking patterns 153.

Figure 2G:
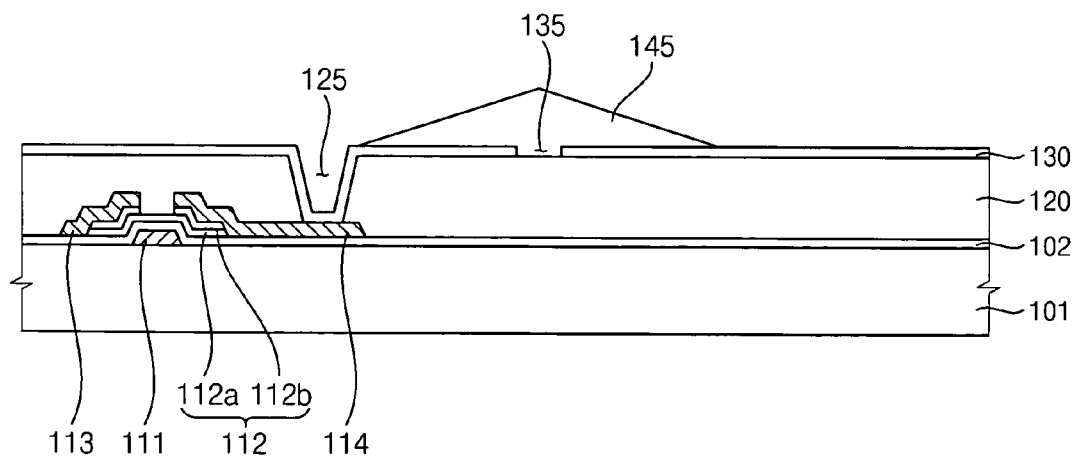

Referring to FIG. 2G, the organic layer 140 exposed to a light is developed by using a developing solution to form a tilted layer 145 having a tapered structure. Since the amount of exposing light is not uniform, the tilted layer 145 has a non-uniform thickness. The tilted layer 145 may cover the boundary portion 135 of the pixel electrode layer 130.

Method of Manufacturing a Common Electrode Substrate

Figure 3A:
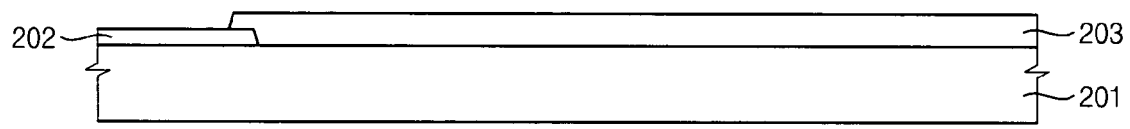
FIGS. 3A to 3C are cross-sectional views illustrating a method of manufacturing a common electrode substrate according to an embodiment of the present invention.
Figure 3B:
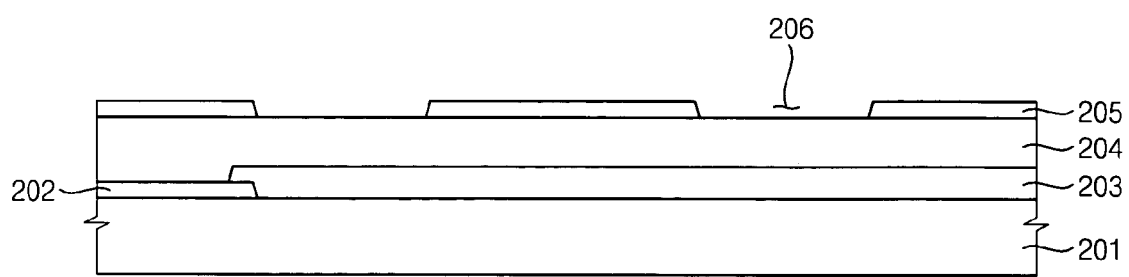
Figure 3C:
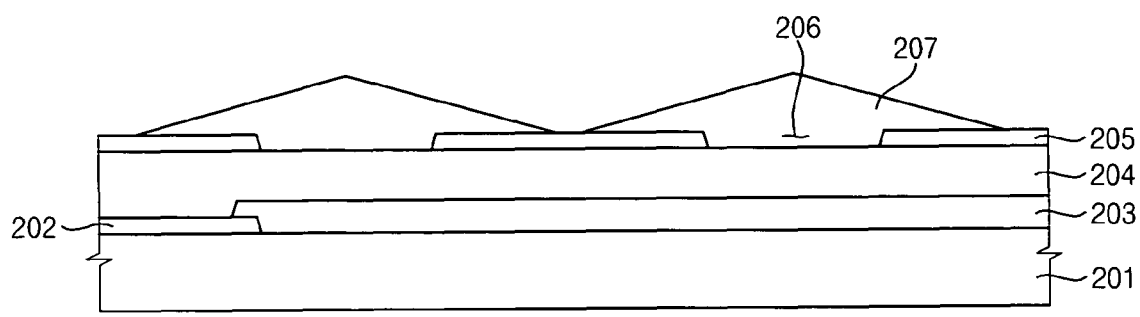
Figure 4:
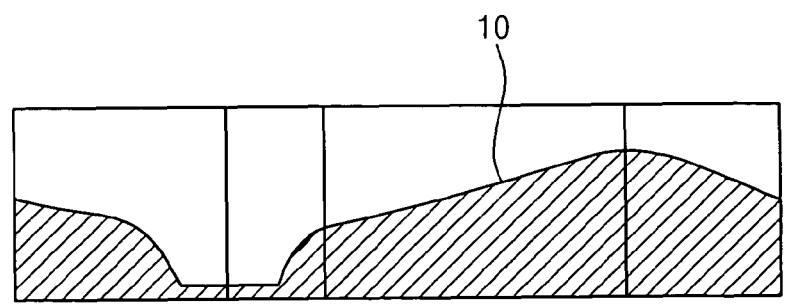
FIG. 4 is a cross-sectional view illustrating an organic layer pattern formed using a photosensitive resin composition in accordance with embodiments of the present invention.

FIGS. 3A to 3C are cross-sectional views illustrating a method of manufacturing a common electrode substrate according to an embodiment of the present invention.

Referring to FIG. 3A, a light-blocking layer 202 is formed on a base substrate 201. Examples of the light-blocking layer 202 may include an organic layer having a black pigment, a chrome layer, a chrome oxide layer, etc. A photosensitive organic layer (not shown) including a pigment is formed on the base substrate 201 having the light-blocking layer 202. The photosensitive organic layer is exposed to a light and is developed to form a color filter layer 203 covering a portion of the light-blocking layer 202.

Referring to FIG. 3B, an insulating layer 204 is formed on the light-blocking layer 202 and the color filter layer 203. The insulating layer 204 protects the light-blocking layer 202 and the color filter layer 203. Examples of the insulating layer 204 may include a silicon nitride layer, a silicon oxide layer, an organic film, etc.

A transparent conducting layer (not shown) is formed on the insulating layer 204. Examples of the transparent conducting layer may include indium tin oxide (ITO), indium zinc oxide (IZO), etc. The transparent conducting layer is etched through a photolithography process to form a common electrode layer 205. The common electrode layer 205 includes a boundary portion 206 to divide the common electrode layer 205 into a plurality of domains. The boundary portion 206 may be a cutout portion.

Referring to FIG. 3C, a photosensitive resin composition is coated on the common electrode layer 205 to form an organic layer (not shown). The photosensitive resin composition includes the above-mentioned photosensitive resin composition according to an embodiment of the present invention. In detail, examples of the photosensitive resin composition may include about 100 parts by weight of an acryl-based copolymer, and about 5 to about 100 parts by weight of a 1,2-quinonediazide compound. The acryl-based copolymer may be prepared by copolymerizing i) about 5 to about 60 percent by weight of an isobonyl carboxylate-based compound based on a total weight of the acryl-based copolymer, ii) about 10 to about 30 percent by weight of an unsaturated compound carrying an epoxy group based on the total weight of the acryl-based copolymer, iii) about 20 to about 40 percent by weight of an olefin-based unsaturated compound based on the total weight of the acryl-based copolymer, and iv) about 10 to about 40 percent by weight of unsaturated carboxylic acid, unsaturated carboxylic acid anhydride, or a mixture of the unsaturated carboxylic acid and unsaturated carboxylic acid anhydride.

The organic layer is exposed to a light through a mask (not shown) and is developed by using a developing solution to form a tilted layer 207 having a tapered structure. The tilted layer 207 may cover the boundary portion 206 of the common electrode layer 205. A detail process of forming the tilted layer 207 is substantially the same as a process of forming the tilted layer in the above-mentioned method of manufacturing a thin-film transistor substrate.

Hereinafter, methods of preparing a photosensitive resin composition and of forming an organic layer pattern will be described in accordance with various examples of the present invention.

Preparation of Acryl-Based Copolymer

Synthesis Example 1

About 10 parts by weight of 2,2'-azobis(2,4-dimethylvaleonitrile), about 200 parts by weight of propylene glycol monomethyl ether acetate, about 20 parts by weight of glycidyl methacrylate, about 30 parts by weight of isobonyl acrylate represented by the above-mentioned chemical formula (I), and about 30 parts by weight of styrene were inserted into a flask having a cooling tube and a mixer to thereby form a mixture solution in the flask. After the mixture was substituted with nitrogen, the mixture solution was stirred slowly. Then, the mixture solution was heated to a temperature of about 62° C. and was maintained for about 5 hours, thereby obtaining an acryl-based copolymer solution. The acryl-based copolymer solution included about 45 percent by weight of a solid ingredient based on total weight of the acryl-based copolymer solution. An acryl-based copolymer in the acryl-based copolymer solution had a weight average molecular weight of the about 12,000 based on polystyrene standards. The weight average molecular weight of the acryl-based copolymer was measured using gel permeation chromatography (GPC).

Preparation of 1,2-quinonediazide Compound

Synthesis Example 2

4,4'-[1-[4-[1-[4-hydroxyphenyl]-1-methylethyl]phenyl] ethylidene]bisphenol 1,2-naphthoquinonediazide-5-sulfonate ester was obtained by a condensation reaction between about 1 mole of 4,4'-[1-[(4-[1-[(4-hydroxyphenyl]-1-methylethyl]phenyl]ethylidene]bisphenol and about 2 moles of 1,2-quinonediazide-5-sulfonate[chloride].

Preparing a Photosensitive Resin Composition Solution

Example 1

About 100 parts by weight of the acryl-based copolymer solution according to Synthetic Example 1 and about 25 parts by weight of 4,4'-[1-[4-[1-[4-hydroxyphenyl]-1-methylethyl]phenyl]ethylidene]bisphenol 1,2-naphthoquinonediazide-5-sulfonate ester according to Synthesis Example 2 were mixed to form a mixture. The mixture was dissolved into diethylene glycol dimethyl ether to form a mixture solution including about 35 percent by weight of a solid ingredient based on a total weight of the mixture solution. The mixture solution was filtrated using a pore filter having pores of about 0.2 μm to thereby obtain a photosensitive resin composition solution.

Forming an Organic Layer Pattern

Example 2

To form an organic layer pattern on a substrate, the photosensitive resin composition solution according to Example 1 was coated on the substrate using a slit/spin coater so that an organic layer was formed on the substrate. The organic layer was dried at a temperature of about 100° C. for about 150 seconds and exposed to a light using MPA-2000 (trade name; manufactured by Canon, Inc. in Japan) as an exposure apparatus. After exposed organic layer was developed for about 150 seconds, the developed organic layer was thermally treated at a temperature of about 220° C. for about 60 minutes, thereby obtaining the organic layer pattern on the substrate. The organic layer pattern had a good exposure sensitivity of about 150 to about mJ/250 cm$^2$ without concave and convex structures at an upper portion thereof. That is, the organic layer pattern had an excellent local flatness at the upper portion thereof.

FIG. 2 is a cross-sectional view illustrating an organic layer pattern formed using a photosensitive resin composition in accordance with embodiments of the present invention.

As shown in FIG. 2, the organic layer pattern includes a mountain structure 10 having a greatly improved local flatness without concave and convex structures in comparison with the organic layer pattern shown in FIG. 1.

According to the present invention, an organic layer pattern formed using a photosensitive resin composition may have a mountain structure having an improved local flatness to thereby ensure more rapid response speed on a liquid crystal formed on the organic layer pattern. Additionally, when the organic layer pattern is employed in a liquid crystal display apparatus, the liquid crystal may be more uniformly aligned because the organic layer pattern has the enhanced local flatness.

The foregoing is illustrative of the present invention and is not to be construed as limiting thereof. Although a few embodiments of the present invention have been described, those skilled in the art will readily appreciate that many modifications are possible in the embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

The invention claimed is:

1. A method of manufacturing a common electrode substrate, the method comprising:
    forming a light-blocking layer on a base substrate;
    forming a color filter layer covering a portion of the light-blocking layer on the substrate;
    forming an insulating layer covering the light-blocking layer and the color filter layer;

forming a common electrode layer having a boundary portion on the insulating layer;

coating a photosensitive resin composition on the common electrode layer to form a photoresist film, the photosensitive resin composition comprising:

about 100 parts by weight of an acryl-based copolymer prepared by copolymerizing i) about 5 to about 60 percent by weight of an isobonyl carboxylate-based compound comprising a compound represented by the chemical formula

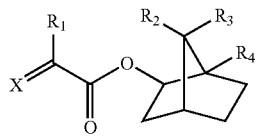

wherein X represents an alkenyl group including $C_1$-$C_{10}$, and $R_1$, $R_2$, $R_3$ and $R_4$ represent hydrogen atoms or alkyl groups including $C_1$-$C_{10}$, ii) about 10 to about 30 percent by weight of an unsaturated compound carrying an epoxy group, iii) about 20 to about 40 percent by weight of an olefin-based unsaturated compound, and iv) about 10 to about 40 percent by weight of one selected from the group consisting of unsaturated carboxylic acid, unsaturated carboxylic acid anhydride, and a mixture of the unsaturated carboxylic acid and unsaturated carboxylic acid anhydride; and about 5 to about 100 parts by weight of a 1,2-quinonediazide compound;

exposing the photoresist film to a light; and developing the photoresist film exposed to the light to form a tilted layer having a tapered structure.

2. The method of claim 1, wherein the exposing of the photosensitive resin composition to a light is performed by using a mask having a plurality of light-blocking patterns spaced apart from each other by predetermined distances.

3. A method of manufacturing a thin-film transistor substrate for a liquid crystal display apparatus, the method comprising:

forming a gate metal pattern comprising a gate electrode on a base substrate;

forming a gate-insulating layer on the gate metal pattern;

forming a channel layer corresponding to the gate electrode on the gate-insulating layer;

forming a source metal pattern comprising a source electrode and a drain electrode on the gate-insulating layer having the channel layer;

forming an overcoating layer that covers the gate-insulating layer, the channel layer, and the source metal pattern, and has a contact hole through which the drain electrode is exposed;

forming a pixel electrode layer that is electrically connected to the drain electrode via the contact hole and has a boundary portion on the overcoating layer;

coating a photosensitive resin composition on the pixel electrode layer to form a photoresist film, the photosensitive resin composition comprising:

about 100 parts by weight of an acryl-based copolymer prepared by copolymerizing i) about 5 to about 60 percent by weight of an isobonyl carboxylate-based compound comprising a compound represented by the chemical formula

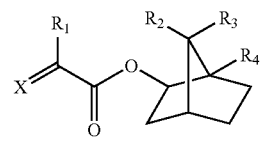

wherein X represents an alkenyl group including $C_1$-$C_{10}$, and $R_1$, $R_2$, $R_3$ and $R_4$ represent hydrogen atoms or alkyl groups including $C_1$-$C_{10}$, ii) about 10 to about 30 percent by weight of an unsaturated compound carrying an epoxy group, iii) about 20 to about 40 percent by weight of an olefin-based unsaturated compound, and iv) about 10 to about 40 percent by weight of one selected from the group consisting of unsaturated carboxylic acid, unsaturated carboxylic acid anhydride, and a mixture of the unsaturated carboxylic acid and unsaturated carboxylic acid anhydride; and about 5 to about 100 parts by weight of a 1,2-quinonediazide compound;

exposing the photoresist film to a light; and developing the photoresist film exposed to the light to form a tilted layer having a tapered structure with a peak centered about a center of the boundary portion to increase a response speed of a liquid crystal formed on the tilted layer, wherein a shape of the tilted layer depends on an amount of light the photoresist film is exposed to.

* * * * *